United States Patent [19]

Ames

[11] Patent Number: 5,698,063
[45] Date of Patent: Dec. 16, 1997

[54] INTERMEDIATE WORKPIECE EMPLOYING A MASK FOR ETCHING AN APERTURE ALIGNED WITH THE CRYSTAL PLANES IN THE WORKPIECE SUBSTRATE

[75] Inventor: John Carlson Ames, Colorado Springs, Colo.

[73] Assignee: Ford Motor Company, Dearborn, Mich.

[21] Appl. No.: 575,971

[22] Filed: Dec. 21, 1995

Related U.S. Application Data

[62] Division of Ser. No. 160,531, Dec. 1, 1993, Pat. No. 5,484,507.

[51] Int. Cl.$^6$ ............................................. C23F 1/02
[52] U.S. Cl. ................. 156/345; 437/228; 148/DIG. 51; 148/33.3; 257/628; 257/774
[58] Field of Search ........................... 156/345, 647, 156/625, 643, 644; 437/228; 148/DIG. 51, 33.3; 257/628, 774

[56] References Cited

U.S. PATENT DOCUMENTS

| | | | |
|---|---|---|---|
| 3,770,533 | 11/1973 | Zwicker | 156/17 |
| 3,977,925 | 8/1976 | Schwabe | 156/13 |
| 3,986,200 | 10/1976 | Allison | 357/55 |
| 4,007,464 | 2/1977 | Bassous et al. | 346/75 |
| 4,397,711 | 8/1983 | Donnelly et al. | 156/643 |
| 4,470,875 | 9/1984 | Poteat | 156/644 |
| 4,733,823 | 3/1988 | Waggener et al. | 239/601 |
| 5,021,364 | 6/1991 | Akamine et al. | 437/228 |
| 5,254,209 | 10/1993 | Schmidt et al. | 156/626 |
| 5,308,442 | 5/1994 | Taub et al. | 156/644 |
| 5,338,400 | 8/1994 | Jerman | 156/647 |
| 5,484,507 | 1/1996 | Ames | 156/644.1 |

*Primary Examiner*—John Niebling
*Assistant Examiner*—Pham Long
*Attorney, Agent, or Firm*—Richard D. Dixon

[57] ABSTRACT

A method for differentially etching an N-sided polygon aperture through a first major surface of a <100> silicon wafer along the <111> planes begins with depositing a mask and defining therein a first intermediate polygon aperture having at least 4N+2 sides, where N is a positive integer. At least one side is generally parallel to the <110> plane, and the intersection of a second side and a third side of the first intermediate polygon is located generally along a major crystal axis perpendicular to the <110> plane. The included angle between the second and third sides expands during anisotropic etching to form one of the N sides of the polygon located along the major axis perpendicular to the <110> plane.

14 Claims, 1 Drawing Sheet

INTERMEDIATE WORKPIECE EMPLOYING A MASK FOR ETCHING AN APERTURE ALIGNED WITH THE CRYSTAL PLANES IN THE WORKPIECE SUBSTRATE

This is a divisional of application Ser. No 08/160,531 filed Dec. 1, 1993 now Pat. No. 5,484,507.

BACKGROUND OF THE INVENTION

1. Field of the Invention

This invention relates to etching features into a semiconductor substrate, and in particular to a method and workpiece for precisely etching an aperture of known cross-sectional area through the substrate.

2. Description of the Prior Art

Injector nozzles for ink jet printers and fuel injectors for internal combustion engines require precise metering of injected fluids, which in turn requires a precise aperture of know cross-sectional area and shape. While silicon micromachining technology allows for relatively precise control of the etching process for the aperture, improved accuracy is often not realized because of the misalignment of the pre-etch mask opening with the crystal lattice. While a circular mask would alleviate the requirement to align to the crystal lattice, computer generated masks can not be generated with a perfect circle. Any polygon used as an approximation for the mask aperture will have straight sides that are misaligned from the crystal lattice because of the limited accuracy of tools used for aligning the mask and the substrate material.

The crystal orientation of the silicon wafer causes a rectangular aperture to be generated by the etching process regardless of the polygon used in the pre-etch mask pattern. If the original mask aperture is chosen as a rectangle or square, then the sides of the polygon must align exactly with the <111> planes of the wafer. Any misalignment results in the final aperture being a square having the largest dimensions in each <111> direction of the original, misaligned square aperture in the pre-etch mask. See FIG. 3 for a visual representation of the rotation of the pre-etch mask aperture and the process by which it creates an aperture of enlarged cross-sectional area in the silicon substrate.

Poteat, in U.S. Pat. No. 4,470,875 discloses a method for constructing an alignment indicator in the silicon wafer to aid in the process of aligning the aperture in the pre-etch mask more precisely with the crystal lattice within the substrate. However, the Poteat process does nothing to improve the mechanical misalignments inherent in the equipment used for aligning the pre-etch mask with the silicon wafer, even when the precise crystal orientation is known. This misalignment is especially significant when it is necessary to etch cooperating apertures through the substrate from opposite sides of the wafer. It is therefore an object of the present invention to define a process for eliminating the enlargement introduced in an aperture etched in a substrate when the aperture in the pre-etch mask is misaligned with respect to the crystal lattice in the substrate.

SUMMARY OF THE INVENTION

A process for removing material from and defining an N-sided polygon aperture of known cross sectional area through a first major surface of a wafer of crystalline material, with the first major surface including therein first and second major crystal axes, begins with depositing on the first major surface a first pre-etch mask defining therein a first intermediate polygon aperture having at least 4N+2 sides where N is a positive integer. At least one side of the first intermediate polygon is generally parallel to the first major crystal axis, and the intersection of a second side and a third side of the first intermediate polygon is located generally along the second major crystal axis. The first major surface of the crystal is anisotropically etched through the first intermediate polygon aperture in the first mask for defining the N-sided polygon aperture in the substrate. The included angle between the second and third sides is expanded through the anisotropic etching process to become another of the N sides of the polygon located along the second major crystal axis, thereby defining the N-sided polygon having a known cross-sectional area. The first mask then may be removed from the first major surface as required.

BRIEF DESCRIPTION OF THE DRAWINGS

Other objects, features and advantages of the present invention may be observed through a study of the written description and the drawings in which.

DETAILED DESCRIPTION OF THE PREFERRED EMBODIMENT

Figure 2:
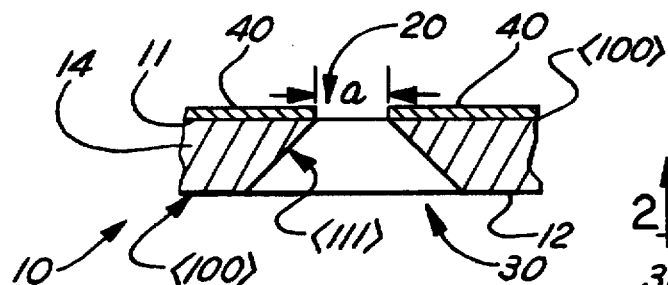
FIG. 2 is a sectioned view taken along cross-sectioned lines 2—2 through the center of the fuel injector nozzle of FIG. 1.
Figure 1:
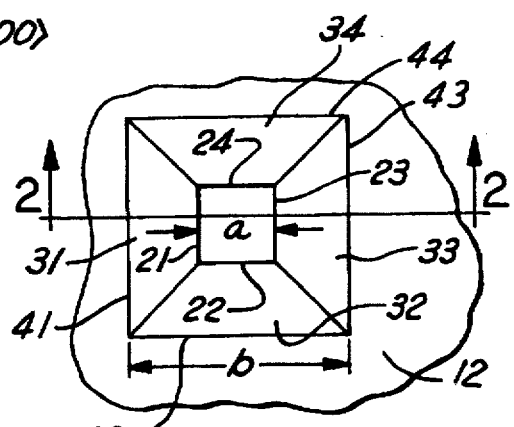
FIG. 1 is a bottom view of a fuel injector nozzle etched into a silicon substrate.
Figure 3:
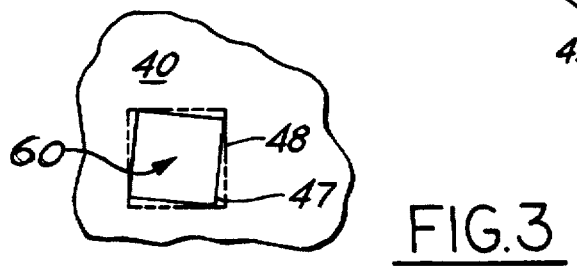
FIG. 3 is a top conceptual illustration of the misaligned aperture in the mask on the silicon substrate, and the resulting enlargement of the etched nozzle.

A typical fuel injector nozzle 10 is illustrated in FIGS. 1 and 2 as comprising a square or nearly square aperture 20 in the upper surface 11 of a silicon substrate 14. The silicon substrate in the preferred embodiment is typically a single crystal silicon wafer and the upper surface 11 is generally in the <100> crystal plane. Aperture 20 is defined by first, second, third and fourth edges, 21, 22, 23 and 24 respectively.

The four sides, illustrated as 31, 32, 33 and 34, of the nozzle 10 are generally located along the <111> crystal plane in the substrate 14. The four sides terminate at a lower surface 12 of the substrate 14 at edges 41, 42, 43 and 44 respectively.

Edges 21 and 41 are generally parallel to each other and to the <110> crystal plane. Edges 23 and 43 are generally parallel to edges 21 and 41, and also to the <110> crystal plane. Edges 22 and 42 are generally parallel to each other and to the <110> crystal plane, which in a silicon crystal lattice is generally perpendicular to the <110> crystal plane.

The dimensions of the upper aperture 20 are critical because the cross sectional area of the aperture 20 serves to meter the fuel ejected under pressure therethrough. While the size of the lower aperture 30 is important, it does not significantly affect the operation of the fuel injector.

Figure 4:
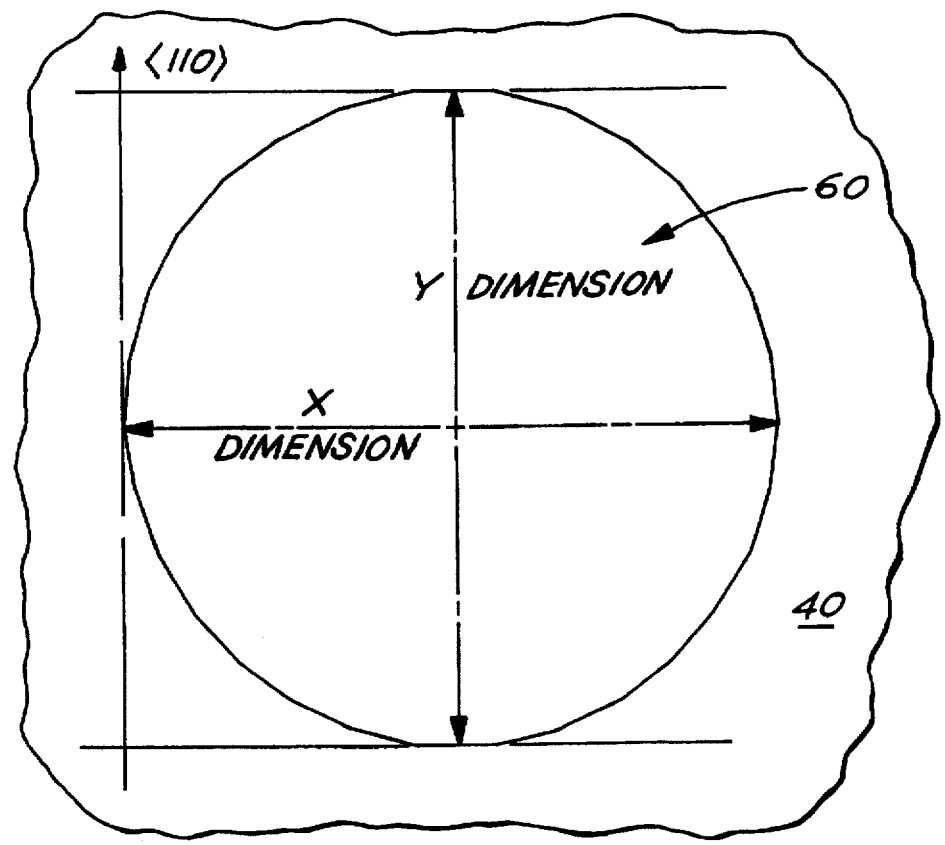
FIG. 4 is a top view of a polygon having 4N+2 sides defined in the mask on the silicon substrate prior to the etching process.

FIG. 4 illustrates an aperture 60 defined in a first silicon dioxide ($SiO_2$) pre-etch mask 40 covering the upper surface 11 of the silicon substrate 14. The aperture is formed from thirty flat sides or facets defining a polygon having a central axis that is generally perpendicular to the upper surface 11 and the <100> crystal plane therein. The x and y dimensions of the aperture 60 as defined in FIG. 4 illustrate that the aperture 60 is a close approximation to a circle. However, it is important to note in FIG. 4 that the upper and lower facets at the extremes of the Y dimension are actually coincident with and generally parallel to the 110 direction, while the facets at the extremes of the X dimension form an angle whose bisecting line is parallel to the <110> plane and the 110 direction, which in silicon is generally perpendicular to the <110> crystal plane. This geometry may be represented by defining the number of facets forming the aperture in the pre-etch material as 4N+2, where N is a positive integer. This ensures that the number of sides in the aperture will always be divisible by 4 while leaving a remainder of two sides. This remainder always assures that the X dimension extremes will be the intersection of two sides and will not be parallel facets.

As illustrated in FIG. 4, the X dimension is measured in a direction perpendicular to the intersection of the <100> and <110> crystal planes. This direction can be said to define a first major crystal axis. Likewise, the Y dimension is measured in a direction parallel to the intersection of the <100> and <110> crystal planes, which intersection and direction can be said to define a second major crystal axis. In silicon, the first and second major axes are perpendicular to and intersect with each other and they both lie within the <100> crystal plane as illustrated in FIG. 1.

With this construction for the aperture 60, a differential or anisotropic etching process using potassium hydroxide and water will cause the <111> plane to change dimensions so slowly that the location of the facet actually functions as an etch stop, while the much faster etching in the <110> crystal plane effectively causes the round aperture 60 to etch into a generally square aperture 20 in the upper surface 11 of the silicon substrate 14. Any inadvertent rotation of the aperture 60 in the mask 40 from the orientation shown in FIG. 4 will cause the X dimension to shrink while the Y dimension will increase within the mask 40, and these self compensating changes will result in the area defined by the aperture 60 being essentially unchanged. This self-compensating function provides fuel injector nozzles having the same size opening, even when used in a mass production process, which therefore will deliver the same volume of fuel under pressure as the ideal aperture construction.

A process for manufacturing the silicon micromachined nozzle would begin with a cleaning of the wafer, and then an initial orientation of the wafer with respect to the flat circumferential section which typically lies in the <110> crystal plane and establishes the <110> direction. The pre-etch mask 40, such as $SiO_2$ or silicon nitride, is formed on the upper surface 11 of the substrate 14. The polygon-shaped aperture 60 having 4N+2 sides is then formed at the desired location in the pre-etch mask by standard photolithographic and etching techniques. The silicon substrate is then anisotropically etched such that the <100> and the <110> crystal planes etch at a much faster rate than in the <111> plane. This differential etching will cause the silicon beneath the pre-etch mask to be removed along the <111> crystal plane as illustrated in FIG. 2. The duration of the etching process can be regulated so that the depth of the aperture within the substrate may be controlled. In the first preferred embodiment, the aperture is etched through the silicon substrate, and the etch time is sufficiently long to allow full etching of the corners of the square aperture in the upper surface of the substrate as illustrated in FIG. 1. The pre-etch mask is then removed using conventional processing techniques.

While in the first preferred embodiment it was assumed that the lower surface 12 of the substrate 14 was protected from the etching process with a mask, it is possible to mask and etch another aperture from the bottom side upward through the substrate. If the two apertures are carefully aligned, then the square aperture cross-sections can be made to be congruent at the point where the apertures join.

While the invention has been described in conjunction with the processing of a square aperture in a silicon substrate in the <100> plane, it should be apparent that other aperture shapes can be manufactured into other crystalline substrates, such as gallium arsenide, lithium niobate or indium phosphide, without departing from the scope and spirit of the present invention. While the preferred embodiments of the present invention have been explained herein, various modifications will be apparent to those skilled in the art. All such variations are considered to be within the scope of the following claims.

I claim:

1. An intermediate workpiece used in a process for removing material from and defining an N-sided polygon aperture of known cross sectional area through a first major surface of a silicon wafer along the <111> plane therein, with the first major surface oriented in the <100> plane, comprising in combination:

a first mask covering the first major surface of the silicon wafer and defining therein a first intermediate polygon aperture having at least 4N+2 sides, where N is a positive integer, with at least one side of said first intermediate polygon being generally perpendicular to the <110> plane, and with the intersection of a second side and a third side of said first intermediate polygon being located generally along a major crystal axis parallel to the <110> plane.

2. The workpiece as described in claim 1, further including:

a second mask, covering a second major surface of the silicon wafer opposite to the first surface, for defining therein a second intermediate polygon aperture having at least 4N+2 sides, with at least one side of said second intermediate polygon being generally perpendicular to the <110> plane, and with the intersection of a second side and a third side of said second intermediate polygon being located generally along a major crystal axis parallel to the <110> plane.

3. The workpiece as described in claim 2 wherein said 4N+2 sides form a hexagon.

4. The workpiece as described in claim 2 wherein a central axis of said first intermediate polygon aperture of said first mask is generally coextensive with a corresponding central axis of said second intermediate polygon aperture of said second mask.

5. An intermediate workpiece used in a process for removing material from and defining an N-sided polygon aperture of known cross sectional area through a first major surface of a wafer of crystalline material, with the first major surface including therein first and second intersecting major crystal axes, comprising in combination:

a first mask deposited upon the first major surface and defining therein a first intermediate polygon aperture having at least 4N+2 sides, where N is a positive integer, with at least one side of said first intermediate polygon aperture being generally parallel to the first major crystal axis, and with the intersection of a second side and a third side of said first intermediate polygon aperture being located generally along the second major crystal axis, whereby the included angle between said second and third sides of said first intermediate polygon aperture will expand through anisotropic etching to form another of the N sides located along the second major crystal axis for defining the N-sided polygon aperture.

6. An intermediate workpiece used in a process for removing material from and defining a first N-sided polygon bore of known cross sectional area through a first major surface of a silicon wafer along the <111> planes therein, with the first major surface oriented in the <100> plane, comprising in combination:

a first mask deposited upon the first major surface and defining therein a first intermediate polygon aperture having at least 4N+2 sides, where N is a positive integer, with at least one side of said first intermediate polygon being generally perpendicular to the <110> plane, and with the intersection of a second side and a third side of said first intermediate polygon being located generally along a line parallel to the <110> plane, whereby the included angle between said second and said third sides of said first intermediate polygon aperture will expand during anisotropic etching to form one of the N sides located along the major axis parallel to the <110> plane.

7. The intermediate workpiece as described in claim 6 wherein said first intermediate polygon aperture comprises a hexagonal aperture, with at least one side thereof parallel to the <110> axis, and with the intersection of a second side and a third side thereof located generally along a major crystal axis perpendicular to the <110> axis, whereby anisotropic etching will enlarge the included angle between said second side and said third side to form one of the N sides located along the major axis perpendicular to the <110> axis.

8. The intermediate workpiece as defined in claim 6, further including:

a second mask deposited upon a second major surface of the intermediate workpiece and defining therein a second intermediate polygon aperture having at least 4N+2 sides, with at least one side of said second intermediate polygon aperture being generally perpendicular to the <110> plane, and with the intersection of a second side and a third side of said second intermediate polygon aperture being located generally parallel to the <110> plane, whereby the included angle between said second and third sides will expand during anisotropic etching to form one of the N sides oriented generally parallel to the <110> plane.

9. The intermediate workpiece as described in claim 8 wherein said second intermediate polygon aperture comprises a hexagonal aperture, with at least one side thereof parallel to the <110> axis, and with the intersection of a second side and a third side thereof located generally along a major crystal axis perpendicular to the <110> axis, whereby anisotropic etching will enlarge the included angle between said second side and said third side to produce one of the N sides located along the major axis perpendicular to the <110> axis.

10. The intermediate workpiece described in claim 8 wherein a central axis of said first intermediate polygon aperture in said first mask is aligned with a central axis of said second intermediate polygon aperture in said second mask for aligning a generally overlapping intersection of the first and second N-sided polygon bores through the silicon wafer.

11. An intermediate workpiece used in a process for removing material from and defining a first generally rectangular bore, having a known cross sectional area and defined along the <111> planes, through a first major surface of a silicon wafer oriented in the <100> plane, comprising in combination:

a first mask shielding the first major surface and defining therein a first intermediate polygon aperture having at least 4N+2 sides, where N is a positive integer, with at least one side of said first intermediate polygon aperture being generally perpendicular to the <110> plane, and with the intersection of a second side and a third side of said first intermediate polygon aperture being located generally along a line parallel to the <110> plane, whereby the included angle between said second and third sides of said first intermediate polygon aperture will expand during anisotropic etching to form an edge of the rectangular bore oriented generally parallel to the <110> planes.

12. The intermediate workpiece described in claim 11, wherein said first intermediate polygon aperture comprises a hexagonal aperture, with at least one side of said hexagonal aperture being generally perpendicular to the <110> plane, and with the intersection of a second side and a third side of said hexagonal aperture being located generally along a line parallel to the <110> plane.

13. The intermediate workpiece as described in claim 11 further including a second mask shielding a second major surface of the silicon wafer oriented in the <100> plane, with said second mask defining therein a second intermediate polygon aperture having at least 4M+2 sides, where M is a positive integer, with at least one side of said second intermediate polygon aperture being generally perpendicular to the <110> plane, and with the intersection of a second side and a third side of said second intermediate polygon aperture being located generally along a line parallel to the <110> plane, wherein the included angle between said second and third sides of said second intermediate polygon aperture will expand during anisotropic etching to form an edge of the second rectangular bore oriented generally parallel to the <110> planes.

14. The intermediate workpiece as described in claim 13 wherein an axis of said first intermediate polygon aperture in said first mask is aligned with an axis of said second intermediate polygon aperture in said second mask for creating an intersection of said first and second intermediate polygon apertures as anisotropic etching progresses.

* * * * *